INVENTOR.
JOHN C. MARTIN
BY John F. Lubra
ATTORNEY

Sept. 14, 1965 J. C. MARTIN 3,206,691

DIRECT VOLTAGE AMPLIFIER

Filed Sept. 6, 1961 2 Sheets-Sheet 2

INVENTOR.
JOHN C. MARTIN

BY John F. Luhrs
ATTORNEY

United States Patent Office 3,206,691
Patented Sept. 14, 1965

3,206,691

DIRECT VOLTAGE AMPLIFIER

John C. Martin, Wickliffe, Ohio, assignor to Bailey Meter Company, a corporation of Delaware Filed Sept. 6, 1961, Ser. No. 136,278
8 Claims. (Cl. 330—9)

This invention relates to amplifying circuits and more particularly to a high input impedance, high gain operational amplifier for amplifying a variable direct voltage input signal with minimum drift.

Present commercially available operational amplifiers for use in direct voltage computing systems or electric control systems are subject to several limitations which affect the accuracy of the system in which they are employed. If a pure D.-C. amplifier is employed lack of stability or drift is a substantial problem which is augmented by temperature effects. In attempts to eliminate the disadvantages of D.-C. amplification, circuits have been utilized which convert the direct voltage input signal to an alternating signal which in turn is amplified and then converted back to a direct voltage output signal. While alternating voltage amplifiers are somewhat less subject to the stability limitations of the direct voltage amplifier, additional problems are created by the necessary signal conversion circuitry which in many instances exceed the problems connected with direct voltage amplification. The use of tuned circuit elements and filter circuits frequently result in poor frequency response and in most instances high gain and high input impedance characteristics are achieved by sacrificing frequency response.

It is a principal object of my invention to provide an improved high gain, high input impedance amplifier for amplifying a direct voltage signal.

Another object of the invention is to combine A.-C. and D.-C. amplifying circuits in an amplifier to obtain the advantages of both circuits and to minimize the disadvantages of each.

Another object of the invention is to convert a direct voltage signal to an alternating voltage signal and vice versa for amplification purposes without affecting the frequency response of the amplifier circuit.

Another object of the invention is to provide shunt modulation at the input of an A.-C. amplifier to convert a direct voltage input signal to an alternating amplifier input signal while retaining a constant amplifier input impedance.

Still another object of the invention is to utilize an oscillator circuit to supply a high frequency alternating signal to a modulator and demodulator of an amplifying circuit and to accomplish direct voltage signals conversion to establish a bias voltage supply of the desired magnitude for the amplifier circuit.

Other objects and advantages will become apparent from the following description taken in connection with the accompanying drawing wherein.

Figure 1:
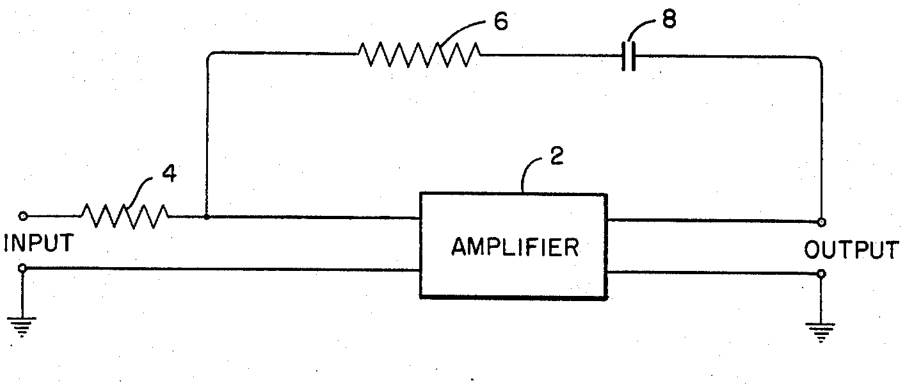
FIG. 1 is a schematic illustration of an operational amplifier circuit.

Referring more particularly to FIG. 1 of the drawings there is shown a basic operational amplifier circuit which includes an amplifier 2 embodying the invention. The circuit includes a passive input impedance comprising a resistance 4 and a passive feedback impedance comprising a resistance 6 connected in series with a capacitor 8. As is well known to those skilled in the art the circuit illustrated is effective in response to a direct voltage input signal to produce an amplified direct voltage output signal with a gain factor determined by the relative magnitudes of the resistances 4 and 6. With the circuit illustrated integral characteristics are introduced into the output signal by capacitor 8. Other impedances may be utilized to achieve different or additional characteristics well known to those skilled in the art.

The amplifier 2 in general comprises a high gain high input impedance direct voltage amplified which utilizes both A.-C. amplifier stages and D.-C. amplifier stages with appropriate signal conversions means to obtain the advantages of both A.-C. and D.-C. amplification while minimizing the disadvantages of each. As a result the amplifier 2 when constructed with the circuit components hereinafter tabulated will have a high open circuit gain and possess temperature stability and good frequency response while at the same time achieving an input impedance of approximately 2 megohms.

Figure 2:
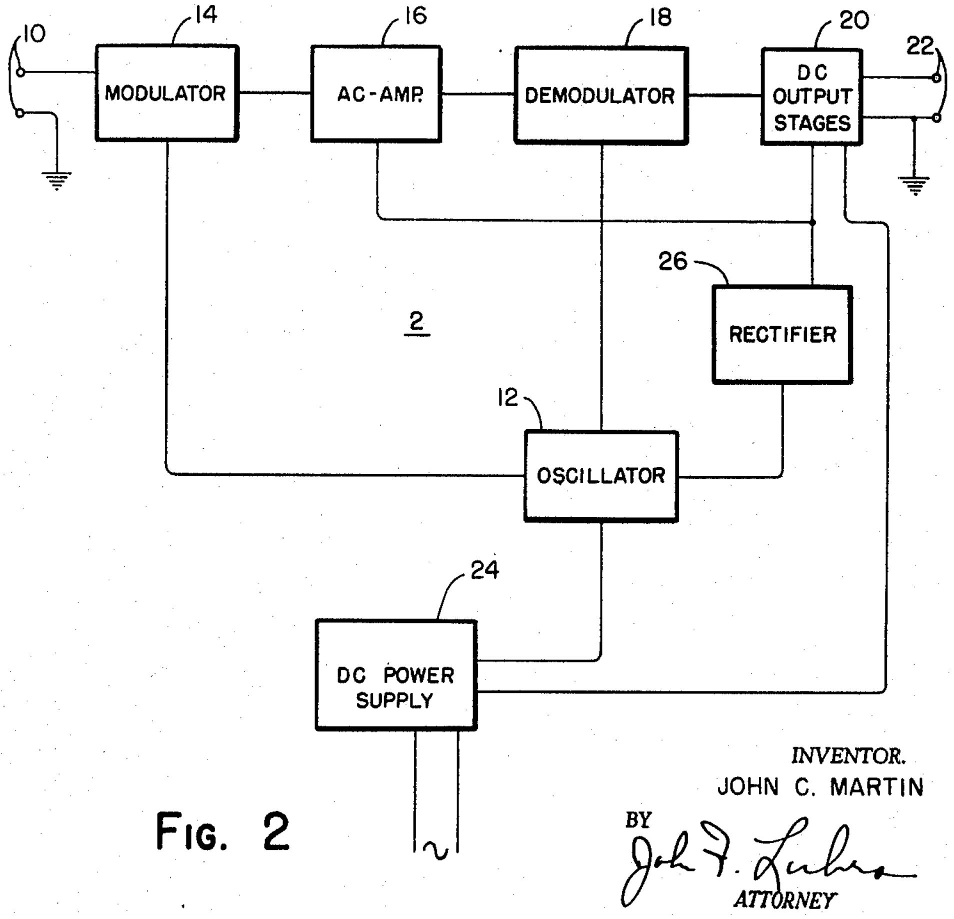
FIG. 2 is a schematic illustration of the amplifier circuit embodying the invention with the major components illustrated in block diagram.

Referring now more particularly to FIG. 2 of the drawings, there is shown in block diagram the major components of my improved amplifier circuit 2. The circuit comprises input terminals 10 to which a variable direct voltage signal is supplied. The input signal modulates a high frequency square carrier wave established by oscillator 12 in modulator circuit 14 to produce an alternating signal which is supplied to a high gain A.-C. amplifier 16. The amplified alternating output signal of amplifier 16 is demodulated in demodulating circuit 18 by means of a demodulating signal supplied by oscillator 12 at the same frequency as the carrier signal to produce a direct voltage output signal. A D.-C. amplifier 20 further amplifies the direct voltage output of demodulator 18 to produce an output signal at the circuit output terminals 22. A single direct voltage power supply 24 connected to an A.-C. source is utilized to provide a regulated direct voltage which energizes oscillator 12. The oscillator 12 is also used in combination with a rectifier circuit 26 to convert the direct voltage output of power supply 24 to a higher magnitude direct voltage which is supplied to amplifying circuits 16 and 20.

Figure 3:
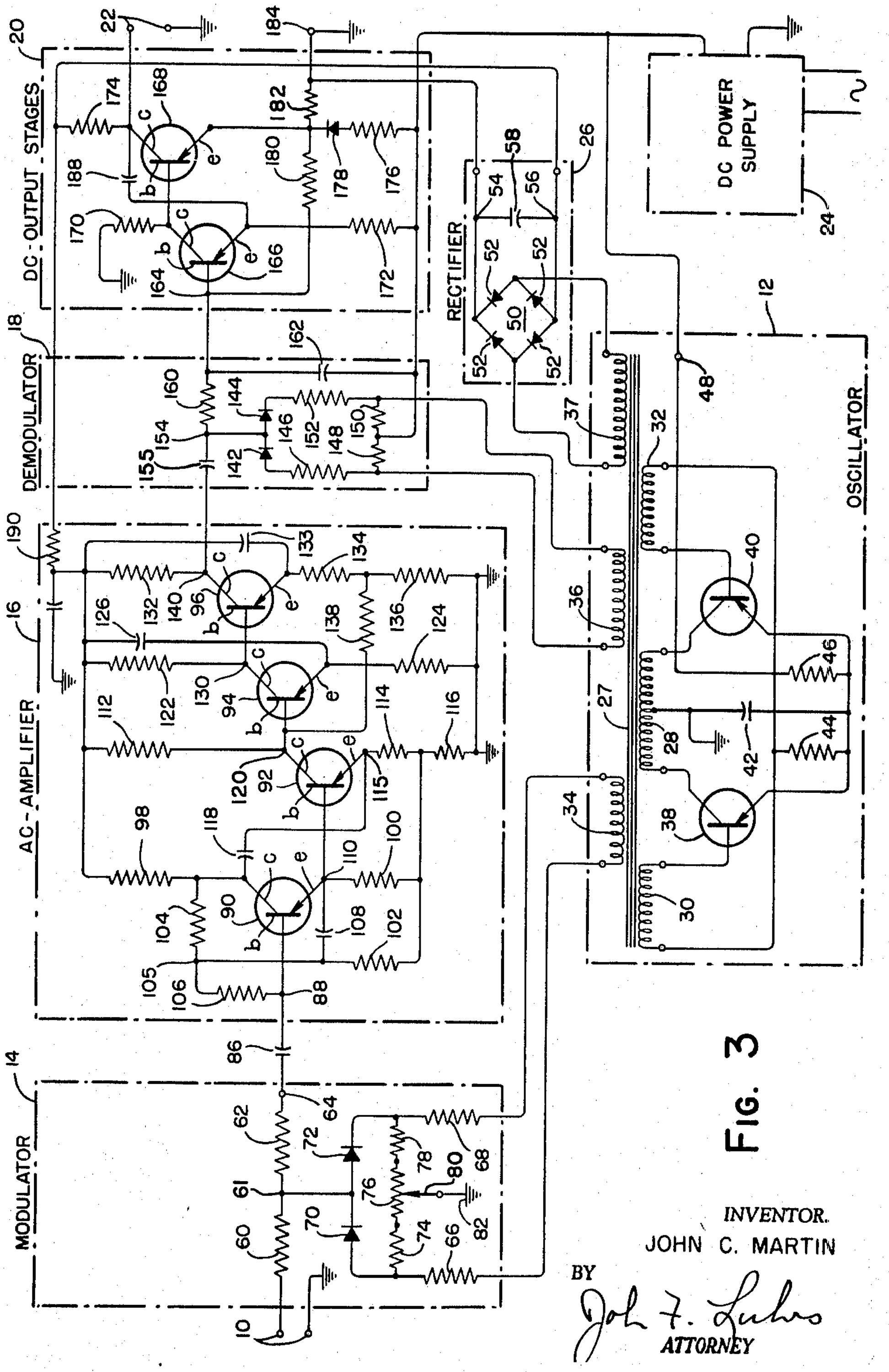
FIG. 3 is a circuit diagram showing in detail the circuitry of the amplifier.

Referring now to FIG. 3 the oscillator circuit 12 comprises a saturable core square wave oscillator having a magnetic core 27 on which is wound primary control winding 28, bias windings 30 and 32 and oscillator output or secondary windings 34, 36 and 37. The oscillator 12 is provided with a pair of transistors 38 and 40 each having its emitter-collector circuit connected in series with one-half of winding 28, a filter capacitor 42, a current limiting resistor 44 and a voltage limiting input resistor 46, the output potential of power supply 24 being supplied to input terminal 48. The circuit 12 operates in a manner well known to those skilled in the art to produce a square wave alternating signal across each of the secondary output windings 34, 36 and 37. For example, an initial unbalance condition producing a negative bias on the base electrode of transistor 38 will cause transistor 38 to conduct causing a current flow through its associated half of winding 28. The resulting change in flux in core 27 will induce a signal in winding 30 to drive the base electrode of transistor 38 more negative to further increase the current flow in the associated half of winding 28. When a condition of saturation of core 27 is reached the voltage across winding 30 is reduced to zero causing transistor 38 to become nonconductive and causing the current flow in winding 28 to become zero. This in turn causes a slight decrease in the core flux which induces a voltage of opposite polarity in windings 30 and 32. The polarity of the voltage drop across winding 32 now causes conduction of transistor 40 and biases transistor 38 nonconductive until a condition of negative saturation is reached to complete the cycle of operation. The circuit will thus oscillate in this manner to produce a high frequency alternating square wave signal across each of windings 34, 36 and 37, the magnitude of the voltage in each winding depending on its turns ratio relative to winding 28.

The rectifier 26 comprises a full wave rectifier bridge circuit 50 having four rectifier elements 52. The bridge circuit is connected across the winding 37 and is operative to produce a full wave rectified signal across terminals 54 and 56, which is utilized as a bias potential for the amplifier circuits 16 and 20. A filter capacitor 58 connected across the terminals 54 and 56 smooths the direct voltage output signal.

Referring now to modulator 14, the input terminals 10 are connected through an input resistor 60 and a modulator stabilizing resistance 62 to the modulator output terminal 64, the resistors 60 and 62 having a common junction at 61. The output winding 34 of oscillator 12 is connected in series with resistors 66 and 68 and diode rectifiers 70 and 72, the common junction of the diodes 70 and 72 being connected to terminal 61. Three serially connected resistors 74, 76 and 78 shunt the diodes 70 and 72, the resistor 76 having adjustable contact arm 80 connected to ground at 82.

The modulator 14 functions as an electric switch to convert the direct voltage input signal applied to terminals 10 ton an alternating input to amplifier circuit 16. When the left end of winding 34 is positive during one half cycle of the oscillator output both diodes 70 and 72 will conduct to short the input signal applied to therminals 10 to ground at 82. During the next half cycle the diodes will be biased non-conductive and a square pulse having an amplitude proportional to the magnitude of the input signal will appear at terminal 64. Thus, the modulator 14 is effective to cyclically short the input signal to ground to produce a square wave input signal at terminal 64 the phase of which depends on the polarity of the input signal applied to terminals 10.

The output terminal 64 of modulator 14 is coupled by a coupling capacitor 86 to input terminal 88 of A.C. amplifier circuit 16. The amplifier 16 in general comprises four direct coupled A.C. amplifying stages formed by transistors 90, 92, 94 and 96, each of which is provided with a base electrode *b*, an emitter electrode *e* and a collector electrode *c*. Transistor 90 forms a high input impedance emitter follower stage having stage bias resistors 98, 100, 102, 104 and 106 and an A.C. feedback capacitor 108. As will later be described in more detail the capacitor 108 is effective to increase the A.C. resistance of resistor 106 to establish a high input impedance for the stage. The stage is provided with an output terminal 110 in the emitter circuit of transistor 90.

Transistor 92 forming the second stage of amplification has its base electrode *b* directly coupled to output terminal 110 of the first stage and is provided with a collector bias resistor 112 and a pair of serially connected emitter resistors 114 and 116 through which the emitter *e* is connected to ground. A capacitor 118 provides an A.-C. feedback circuit from emitter *e* of transistor 92 to collector *c* of transistor 90 to further increase the input imepdance of the first stage.

Transistor 94 forming the third A.-C. amplifying stage has its base electrode *b* direct coupled to output terminal 120 in the collector circuit of the previous stage and is provided with a bias and load resistor 122 in the collector circuit, an emitter resistor 124, and a by-pass capacitor 126. To complete the A.-C. amplifier circuit 16 the base electrode *b* of transistor 96 is direct coupled to output terminal 130 of the third stage and provided with a bias resistor 132 in its collector circuit and a by-pass capacitor 133. The emitter of transistor 96 is connected to ground through resistors 134 and 136, the common junction of which is connected to the base electrode of transistor 94 through resistor 138. An output terminal 140 is provided in the collector circuit of transistor 96.

The demodulator circuit 18 is effective to remove the high frequency carrier wave established by modulator 14 to establish a direct voltage signal having a magnitude and polarity dependent on the magnitude and phase of the alternating output signal at terminal 140. The demodulator circuit 18 in effect forms an electronic switch similar to modulator circuit 14 having a pair of diode rectifier elements 142 and 144 connected in a circuit with resistors 146, 148, 150 and 152, the circuit being coupled to output secondary winding 36 of oscillator 12. The common junction of diodes 142 and 144 is coupled to terminal 154. A coupling capacitor 155 connects the terminals 140 and 154.

The terminal 154 is connected through a resistor 160 which forms an RC filter circuit with capacitor 162 to the input terminal 164 of the D.-C. amplifier circuit 20. The circuit 20 in general comprises two amplifying stages formed by transistors 166 and 168 each of which is provided with a base electrode *b*, an emitter electrode *e* and a collector electrode *c*. Transistor 166 forms the input stage of amplification and is provided with a collector resistor 170 and an emitter resistor 172.

Transistor 168 is similarly provided with a collector resistor 174 and an emitter resistor 176 connected in series with a diode element 178. Diode element 178 provides temperature stabilization of transistor 166. The emitter of transistor 168 is connected through a bias resistor 180 to the base electrode of transistor 166 and through resistor 182 to ground at 184. The collector electrode of transistor 168 is coupled to output terminal 22 for the entire circuit and coupled through a negative feedback capacitor 188 to the emitter electrode of transistor 166. The capacitor 188 filters the higher frequency A.-C. signals appearing in the output signal at terminal 22.

To complete the circuitry of the amplifier, output terminal 56 of the power supply bridge 50 is connected to the upper end of resistor 174 to establish the collector voltage for the D.-C. amplifier circuit and connected through a resistor 190 to the resistors 98, 112, 122, 132 of the A.-C. amplifier 16 to establish the circuit bias therefor.

The following table lists appropriate values for the circuit elements illustrated in FIG. 1. It will be apparent however that many equivalents and valuations are possible and the values indicated are for purposes of disclosure and not of limitation:

| Circuit Element: | Value |
|---|---|
| Resistor 46 | 100 ohms. |
| Resistor 44 | 400 ohms. |
| Resistor 60 | 2 meg. |
| Resistor 62 | 200K. |
| Resistor 66 | 2K. |
| Resistor 68 | 2K. |
| Resistor 74 | 470 ohms. |
| Resistor 78 | 470 ohms. |
| Resistor 76 | 200 ohms. |
| Resistor 98 | 22K. |
| Resistor 100 | 4K. |
| Resistor 102 | 4K. |
| Resistor 104 | 6.2K. |
| Resistor 106 | 10K. |
| Resistor 112 | 20K. |
| Resistor 114 | 2K. |
| Resistor 116 | 1K. |
| Resistor 122 | 13K. |
| Resistor 124 | 10K. |
| Resistor 132 | 8.2K. |
| Resistor 134 | 6.2K. |
| Resistor 136 | 10K. |
| Resistor 138 | 10K. |
| Resistor 146 | 560 ohms. |
| Resistor 148 | 500 ohms. |
| Resistor 150 | 500 ohms. |
| Resistor 152 | 560 ohms. |
| Resistor 160 | 5.6K. |
| Resistor 170 | 100K. |
| Resistor 172 | 100 ohms. |
| Resistor 174 | 10K. |
| Resistor 176 | 68 ohms. |
| Resistor 180 | 68K. |
| Resistor 182 | 18K. |
| Resistor 190 | 20K. |
| Capacitor 42 | 25 m.f.d. |
| Capacitor 58 | 8 m.f.d. |
| Capacitor 86 | .1 m.f.d. |
| Capacitor 108 | 10 m.f.d. |
| Capacitor 118 | 250 m.f.d. |
| Capacitor 126 | 100 m.f.d. |
| Capacitor 133 | 250 m.f.d. |
| Capacitor 155 | 20 m.f.d. |
| Capacitor 162 | 250 m.f.d. |
| Capacitor 188 | .22 m.f.d. |
| Capacitor 192 | 50 m.f.d. |
| Diode 52 | Type IN538. |
| Diodes 70 and 72 | Type IN300. |
| Diodes 142 and 144 | Type IN538. |
| Diode 178 | Type SG22. |
| Transistor 38 | Type 2N 376A. |
| Transistor 40 | Type 2N 376A. |
| Transistor 90 | Type 2N 519A. |
| Transistor 92 | Type 2N 655. |
| Transistor 94 | Type 2N 655. |
| Transistor 96 | Type 2N 655. |
| Transistor 166 | Type 2N 655. |
| Transistor 168 | Type 2N 158. |

*Operation*

In operation of the circuit oscillator 12 functions to continuously establish a high frequency alternating signal across primary winding 28. This alternating signal is induced into secondary windings 34 and 36 and applied to the modulator 14 and demodulator 18 respectively which function to convert the direct voltage input signal at terminals 10 into an alternating signal and the output of A.-C. amplifier circuit 16 at terminal 140 to a direct voltage signal. Additionally, the oscillator output is induced into winding 37 and rectified in bridge circuit 50 to establish a direct voltage across terminals 54 and 56 of a magnitude suitable to bias A.-C. amplifier 16 and provide the collector voltage for D.-C. amplifier 20. Thus the oscillator 12 functions to generate an alternating signal to modulator 14 and demodulator 18 and additionally functions to convert the direct voltage of source 24 to the desired magnitude for biasing the amplifier stages thereby eliminating the need for more than one regulated power supply for the entire circuit.

The alternating signal across winding 34 is effective in the manner previously described to effect conduction of diodes 70 and 72 during alternate half cycles of the oscillator output to establish a square wave alternating signal input to A.-C. amplifier circuit 16, the phase of the alternating signal depending on the polarity of the direct voltage input signal. This shunt modulation effectively converts the direct voltage input signal to an alternating signal without affecting the input impedance of the circuit 2 thus insuring a constant input impedance regardless of the magnitude of the direct voltage input signal.

The A.-C. amplifier 16 is effective to amplify the alternating output signal of modulator 14 and with the components hereinbefore tabulated will have an open circuit gain of approximately 20,000. Each transistor functions in a manner well known to those skilled in the art, a variation in base potential being effective to cause a corresponding variation in the output potential of the associated stage output terminal.

The first two stages of the A.-C. amplifier 16 provide a unique result in that the necessary bias circuitry is provided to achieve temperature stability and to additionally establish a high circuit input impedance. In regard to transistor 90, to achieve temperature stability, the resistance values of resistors 104, 106 and 102 must be small relative to the value of resistor 100. This design technique however tends to limit the input impedance of the circuit in that a low resistance circuit is created from input terminal 88 through resistor 106, resistor 102 and resistor 116 of the second stage to ground. This tends to shunt a considerable portion of the input current to ground reducing the gain of the stage and decreasing the input impedance. To prevent this condition while at the same time insuring temperature stability, capacitor 108 is provided to establish an A.-C. circuit between emitter *e* of transistor 90 and the common junction 105 of resistors 106 and 104 in the base electrode bias circuit. This establishes an alternating potential at junction 105 substantially equal to the emitter potential thereby reducing the alternating potential difference between junction 105 and terminal 88. In effect, this increases the A.-C. resistance of the circuit containing resistors 106, 102 and 116 to increase the input impedance. The effective A.-C. resistance of the circuit is further augmented by the A.-C. potential at terminal 115 established by the second stage comprising transistor 92 and the provision for A.-C. feedback from the second stage to the first stage through capacitor 118.

The A.-C. amplifier 16 is thus effective to establish a high input impedance without sacrificing temperature stability. The alternating output signal of amplifier 16 appearing at terminal 140 is demodulated by the demodulator circuit 18 to establish a direct voltage signal at terminal 154 having an amplified relationship with the direct voltage input signal applied to terminals 10. The demodulator 18 functions similar to modulator 14, diodes 142 and 144 being conductive during alternate half cycles at the frequency of the carrier signal to effect demodulation.

The filter circuit comprising resistor 160 and capacitor 162 smooths the direct voltage output of demodulator 18 to establish a smooth direct voltage signal which is applied to input terminal 164 of the direct voltage amplifier 20.

The amplifier circuit 20 functions to further amplify the direct voltage signal at terminal 164 to establish a final direct voltage output signal at terminals 22. With components as hereinbefore tabulated the direct voltage amplifier circuit 20 will have an open circuit gain of approximately 500.

An important feature of the circuitry disclosed is the use of both A.-C. and D.-C. amplifier circuits. As previously mentioned with the components herein tabulated the open circuit gain of A.-C. circuit 16 taken alone is approximately 20,000 while the corresponding open circuit gain of the D.-C. amplifier circuit taken alone is approximately 500. With the addition of the modulator and demodulator and when the circuit 2 is utilized as an operational amplifier in the circuit of FIG. 1 the total circuit gain is reduced to approximately 10,000.

The use of D.-C. amplification for the final output circuit decreases the power consumption of the demodulator and permits the use of a smaller filter capacitor to filter the demodulated alternating signal. Since frequency response is affected by the filter capacitor, good frequency response is achieved along with low power consumption. The use of a high frequency carrier signal also minimizes the size of the filter capacitor required and contributes substantially to the frequency response characteristics of the amplifier.

One particular feature of the circuit is the absence of tuned circuit elements. Thus the frequency of the carrier signal generated by oscillator 12 can vary considerably without affecting operation of the amplifier circuit. The absence of tuned circuit elements also contributes to the good frequency response characteristics.

By employing D.-C. amplification only in the last lower gain amplifier section 20 the output drift which is inherent in D.-C. amplification is not a problem. Since the D.-C. amplifier section is preceded by the high gain A.-C. section the output drift when referred to the A.-C. amplifier input is small and thus negligible. I have thus found that by utilizing a high gain A.-C. amplifier section in combination with a lower gain D.-C. amplifier section that minimum power consumption, good frequency response, good temperature stability and negligible drift can be achieved.

It will now be apparent that the amplifier circuitry disclosed herein possesses considerable advantage over prior art amplifying circuitry. The circuit requires only a single regulated direct voltage power supply and provides a high constant input impedance while at the same time achieving optimum temperature stability and utilizing the advantages of both A.-C. and D.-C. amplification in a single circuit.

While only one embodiment of the invention has been herein shown and described, it will be apparent to those skilled in the art that many changes may be made in the construction and arrangement of parts without departing from the scope of the invention as defined in the appended claims.

It is claimed and desired to secure by Letters Patent of the United States:

1. An amplifier circuit for amplifying a direct voltage input signal comprising, a direct voltage source, an oscillator circuit connected to said source and operative to establish an alternating carrier signal, a modulator circuit coupled to said oscillator for effecting shunt modulation of said carrier signal by the direct voltage input signal, a plural stage transistorized alternating signal amplifier connected to said modulator circuit for amplifying said modulated signal having an input stage to establish a high input impedance and a direct connected second stage of amplification, a circuit establishing A.-C. feedback from said second to said first stage to augment said input impedance, means coupled to said oscillator and connected to the last amplification stage for demodulating the output of said alternating signal amplifier, and a plural stage direct voltage amplifier circuit connected to said demodulating means for further amplifying the output of said means to establish a final direct voltage output signal.

2. An amplifier circuit as claimed in claim 1 wherein said input stage of said alternating signal amplifier comprises a transistor having base, emitter and collector electrodes and bias curcuits therefor, said input stage having an emitter follower circuit configuration and an output terminal in its emitter circuit, said base electrode being connected to the output of said modulating means.

3. An amplifier circuit as claimed in claim 2 wherein a capacitance is connected between said emitter electrode and the bias circuit for said base electrode to further augment said input impedance.

4. An amplifier circuit as claimed in claim 3 wherein said second stage of said alternating signal amplifier comprises a transistor having base, emitter and collector electrodes and an output terminal in the collector electrode circuit, said base electrode of said second stage being connected to said output terminal of said input state, said A.-C. feedback circuit comprising a capacitor connected between said emitter electrode of said second stage and the collector electrode of said input stage.

5. An operational amplifier circuit having an input circuit for receiving a D.C. voltage signal, a feedback circuit connected to said input circuit, an amplifier circuit connected to the junction of said input and feedback circuits comprising, a diode shunt modulator circuit connected to the junction of said input and feedback circuits for converting the D.C. voltage signal to a proportional alternating signal, a high gain alternating signal amplifier for amplifying said alternating signal having first, second, third and fourth stages of amplification each comprising an electrical transistor coupled to a source of bias voltage, a diode demodulator circuit connected to the output of said fourth stage of amplification for converting the amplified alternating signal to a proportional D.C. voltage signal, a D.C. power amplifier connected to the output of said demodulator for power amplification of said last mentioned D.C. voltage signal to establish a final D.C. voltage output signal, said D.C. power amplifier having first and second stages of amplification each including a transistor with a base, emitter and collector electrode, the output of said D.C. power amplifier being connected to said feedback circuit, and a capacitor connected from the collector of said second stage to the emitter of said first stage for A.C. stabilization of said D.C. amplifier.

6. A temperature stabilized high input impedance direct current amplifier, comprising, an input circuit for receiving the direct current signal to be amplified, a diode shunt modulator connected to said input circuit for converting a direct current signal to a proportional alternating signal, a transistorized alternating signal amplifier having at least a first and second stage of amplification, said first stage comprising a transistor having a base electrode connected to the junction of said input circuit and said diode shunt modulator, a collector electrode connected to a bias supply and an emitter electrode connected to the base electrode of said second stage transistor, said second stage transistor also having an emitter and collector electrode, said amplifier also including two bias resistors connected in series from the base to collector electrode of said first transistor, a capacitor connected from the emitter electrode of said first transistor to the junction of said bias resistors, and a second capacitor connected from the emitter electrode of said second transistor to the collector electrode of said first transistor, a diode demodulator coupled to the output of said alternating signal amplifier for converting said amplified alternating signal to a proportional direct current signal, and a transistorized direct current amplifier connected to said demodulator for affecting power amplification of said direct current signal to establish a final direct current output signal.

7. A temperature stabilized high input impedance direct current amplifier as set forth in claim 6 wherein said transistorized direct current amplifier has at least two stages of amplification, said first stage including a transistor having a base electrode connected to said demodulator, an emitter electrode connected to a bias supply and a collector electrode connected to the base electrode of said second transistor, said second transistor having an emitter electrode connected to a bias supply, and a collector electrode connected to an output terminal, said direct current amplifier also including a feedback capacitor from the collector electrode of said second transistor to the emitter electrode of said first transistor.

8. A temperature stabilized high input impedance direct current amplifier as set forth in claim 7 wherein said transistorized direct current amplifier includes a diode connected between the bias supply and said emitter electrode of said second transistor for temperature drift compensation.

References Cited by the Examiner

UNITED STATES PATENTS

| | | | |
|---|---|---|---|
| 1,739,494 | 12/29 | Affel | 330—10 X |
| 2,492,863 | 12/49 | Hays. | |
| 2,509,621 | 5/50 | Willoughby | 330—10 X |
| 2,806,989 | 9/57 | Shoup. | |
| 2,858,379 | 10/58 | Stanley | 330—28 X |
| 2,870,393 | 1/59 | Whitehead | 30—10 X |
| 3,017,749 | 1/62 | Heppler et al. | 330—10 X |
| 3,031,627 | 4/62 | Reichert et al. | 330—26 X |
| 3,058,068 | 10/62 | Hinrichs et al. | 330—10 |

ROY LAKE, *Primary Examiner.*

ARTHUR GAUSS, *Examiner.*